United States Patent [19]

Osakabe et al.

[11] 4,280,199

[45] Jul. 21, 1981

[54] APPARATUS FOR SCANNING AN ADDRESSABLE MEMORY

[75] Inventors: Yoshio Osakabe; Hiroshi Yasuda, both of Yokohama, Japan

[73] Assignee: Sony Corporation, Tokyo, Japan

[21] Appl. No.: 63,383

[22] Filed: Aug. 3, 1979

[51] Int. Cl.³ .......................... G11C 8/00; H03J 7/06
[52] U.S. Cl. ................................... 365/236; 365/239; 455/166
[58] Field of Search ................ 365/236, 239; 455/179, 455/183, 185, 161, 165, 166

[56] References Cited

U.S. PATENT DOCUMENTS

| 3,845,394 | 10/1974 | Hamada | 455/166 |
| 3,883,808 | 5/1975 | Boone et al. | 455/166 |
| 3,968,443 | 7/1976 | Leuschner | 455/166 |

Primary Examiner—Stuart N. Hecker
Attorney, Agent, or Firm—Lewis H. Eslinger; Alvin Sinderbrand

[57] ABSTRACT

Apparatus for scanning an addressable memory includes a clock pulse generator and an address counter for counting the clock pulses so as to produce an address for the addressable memory and thereby designate a corresponding storage location from which stored data is read. The clock pulse generator is selectively enabled to supply clock pulses to the address counter. A scan advance circuit is selectively operable to change the count of the address counter by a predetermined amount in response to each operation thereof, and thereby change the designated storage location in the addressable memory. Successive operations of the scan advance circuit result in a step-wise change in the address.

15 Claims, 3 Drawing Figures

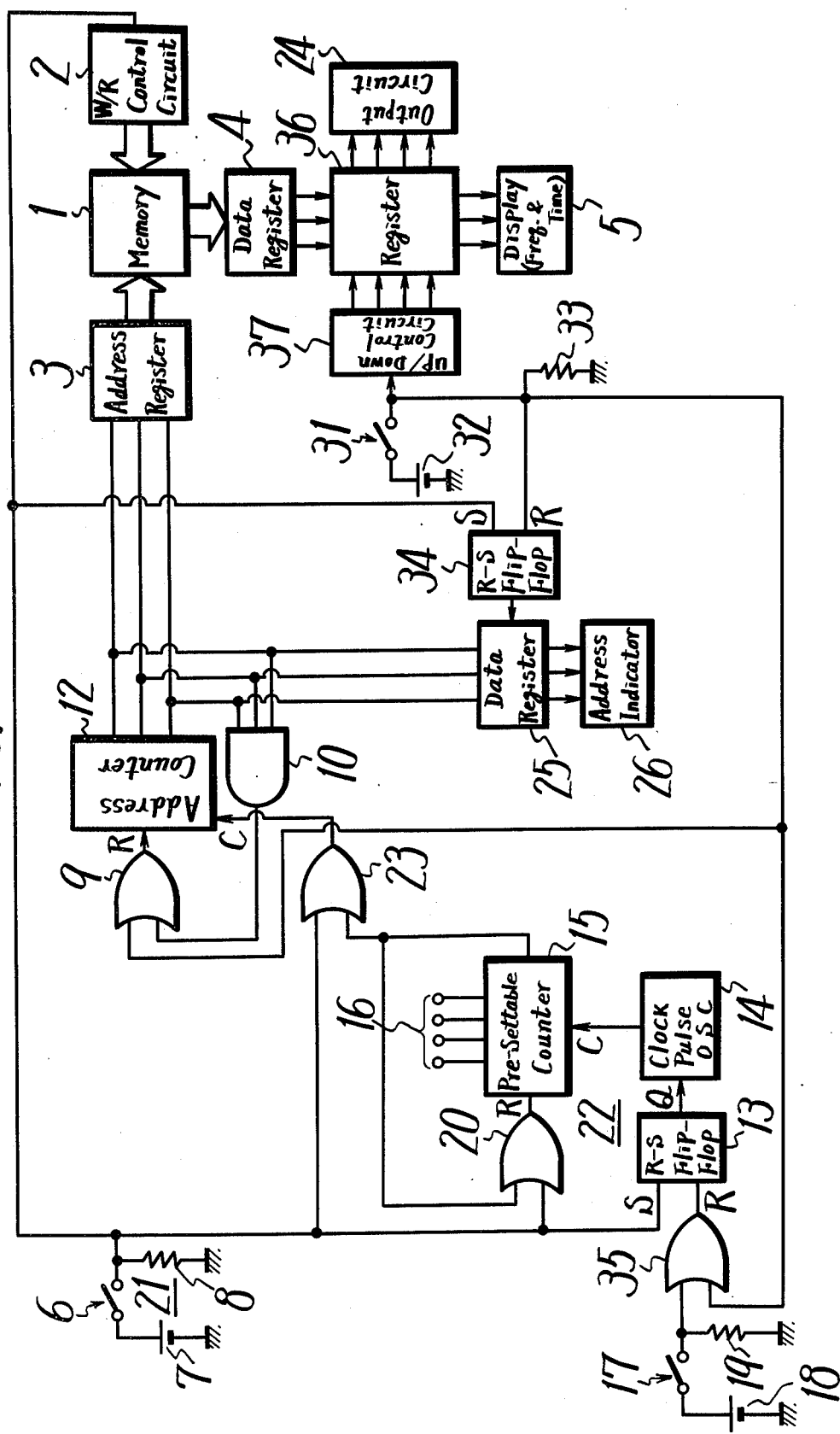

APPARATUS FOR SCANNING AN ADDRESSABLE MEMORY

BACKGROUND OF THE INVENTION

This invention relates to apparatus for scanning an addressable memory and, more particularly, to such apparatus wherein the memory may be scanned in a step-wise manner in accordance with periodic clock pulses or in response to a selective scan advance circuit to, for example, scan the memory at a rate faster than the clock pulses.

In a typical electronic tuner, such as a tuner that can be used in a video or radio receiver, the particular channel, or broadcast frequency, to which the tuner can be tuned is controlled by a digital signal. Such a so-called digital electronic tuner is provided with an addressable memory into which digital signals representing corresponding channels, or broadcast frequencies, are written. Depending upon the address of the memory which is selected, the digital signal stored therein is read out and used to determine the tuning condition of the digital electronic tuner.

One example of a digital electronic tuner is disclosed in copending application Ser. No. 938,384, assigned to the assignee of the present invention. In this pending application, the tuning circuitry is a phase-locked loop having a voltage-controlled oscillator (VCO) whose oscillating frequency is determined by the digital signal read from the addressable memory, which oscillating signal is used as the local oscillating signal in the tuning circuit. Essentially, a programmable frequency divider divides the frequency of the oscillating signal generated by the VCO, which frequency-divided oscillating signal is phase-compared to a reference frequency. The dividing ratio of the programmable divider is established by the digital signal read from the addressed memory. As the dividing ratio changes, the frequency of the local oscillating signal generated by the VCO likewise changes.

Another example of an electronic digital tuner is disclosed in copending application Ser. No. 897,394, now U.S. Pat. No. 4,194,159, also assigned to the assignee of the present invention. In this example, a variable capacitance element, such as a Varicap diode, is controlled by an analog voltage which is derived from a digital signal read from the addressed memory. Another example of this type of electronic digital tuner is described in U.S. Pat. No. 3,940,702.

In a typical electronic digital tuner of the foregoing types, the addressable memory may be provided with only a limited number of storage locations such that only a limited number of predetermined channels, or broadcast frequencies, can be stored therein and rapidly selected. For example, such an addressable memory can be provided with six to eight addressable locations. In the event that the use wishes to sample the program information which then is being broadcast over these predetermined channels, or broadcast frequencies, a memory scanning circuit is activated so as to scan the addressable memory and thereby read, sequentially, each digital signal stored therein in a step-wise manner.

One type of scanning circuit which can be used to scan the addressable memory includes a clock pulse generator, an address counter and an address register. To initiate a scanning cycle, the clock pulse generator is activated so as to supply periodic clock pulses to the address counter. The count of the address counter is incremented (or decremented) in response to each clock pulse; and the instantaneous count of the address counter is stored in the address register and used as the memory address. The count of the address counter, and thus, the memory address, changes at a rate which is determined by the frequency of the clock pulses supplied to the counter. In general, such clock pulses are supplied at a relatively low rate, such as on the order of one clock pulse every four or five seconds, so as to change the memory address at a correspondingly slow rate. This enables the user to evaluate the program information which then is received over the channel, or broadcast frequency, that has been read from the memory. Once a desired channel, or broadcast frequency, is received, the scanning operation may be terminated.

It is appreciated that, in accordance with the foregoing example wherein representations of six to eight channels, or broadcast frequencies, are stored in the memory, and wherein the memory address is incremented (or decremented) once every four or five seconds, up to forty seconds may elapse until all of the predetermined channels, or broadcast frequencies, which are "stored" in the memory have been sampled. There are many applications wherein such a long delay in this scanning operation is undesired.

OBJECTS OF THE INVENTION

Therefore, it is an object of the present invention to provide improved apparatus for scanning an addressable memory which overcomes the aforenoted disadvantage.

Another object of this invention is to provide apparatus for scanning an addressable memory wherein the memory may be scanned either in response to periodic clock pulses which are used to increment an address counter, or in response to a selectively operable switch which, when operated, also increments the address counter.

Yet another object of this invention is to provide apparatus which can be manually operated to scan an addressable memory.

Various other objects, advantages and features of the present invention will become readily apparent from the ensuing detailed description, and the novel features will be particularly pointed out in the appended claims.

SUMMARY OF THE INVENTION

In accordance with the present invention, apparatus is provided for scanning an addressable memory, including a clock pulse generator and an address counter for counting the clock pulses so as to produce an address which designates a corresponding storage location in the memory from which stored data is read. The clock pulse generator is selectively enabled; and a scan advance circuit is selectively operable to change the count of the address counter by a predetermined amount in response to each operation thereof, and thereby change the designated storage location in the addressable memory. If the scan advance circuit is operated sequentially, the memory is scanned in a step-wise manner as a result of the step-wise incrementing (or decrementing) of the address counter.

BRIEF DESCRIPTION OF THE DRAWINGS

The following detailed description, given by way of example, will best be understood in conjunction with the accompanying drawings in which:

FIG. 3 is a block diagram of yet another embodiment of apparatus in accordance with the present invention for scanning an addressable memory.

DETAILED DESCRIPTION OF PREFERRED EMBODIMENTS

Figure 1:
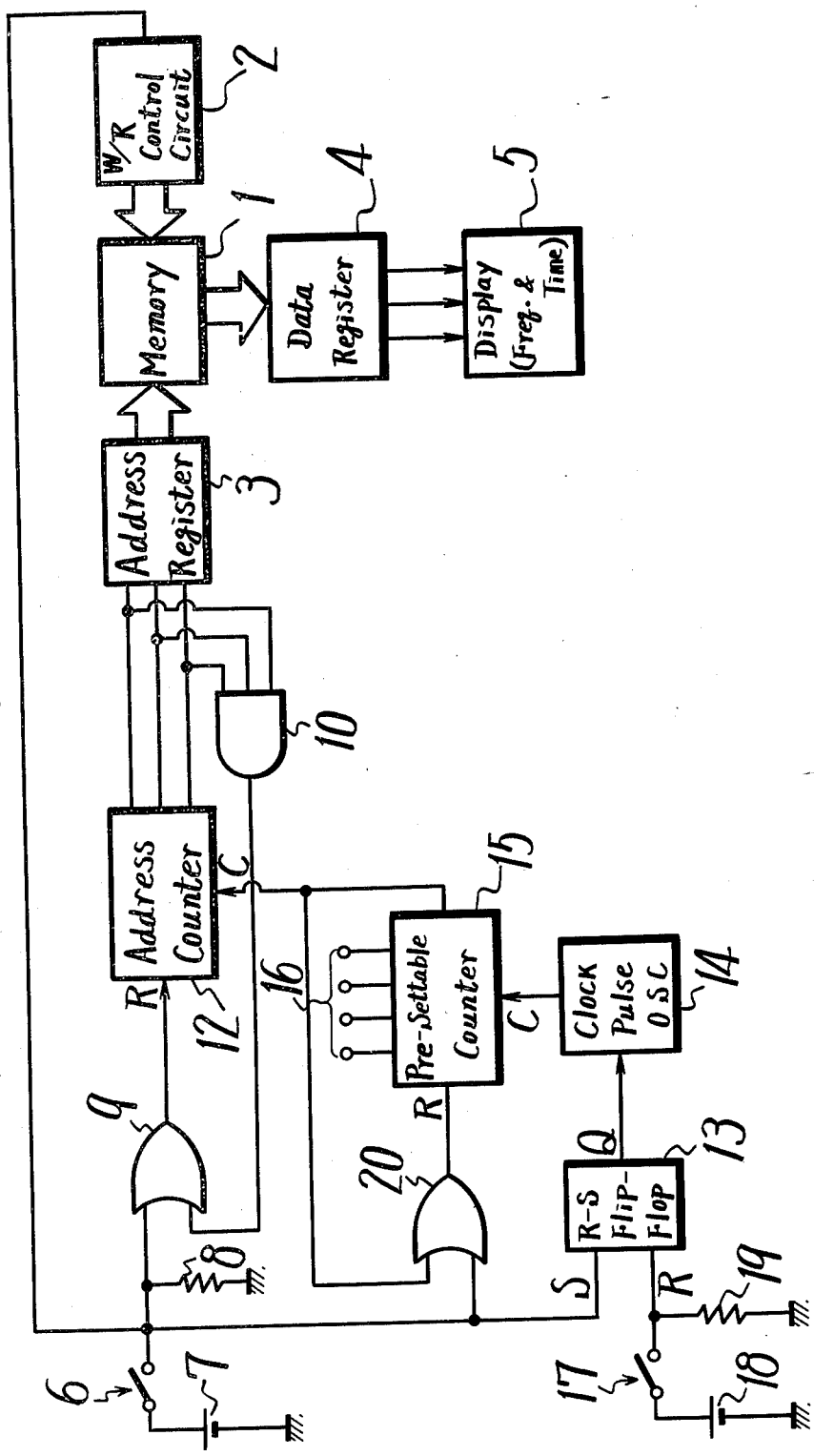
FIG. 1 is a block diagram of one example of a prior art scanning circuit for an addressable memory.

Referring to the drawings, wherein like reference numerals are used throughout, and in particular to FIG. 1, there is illustrated an embodiment of a prior art scanning circuit for an addressable memory. It is believed that once this prior art circuit is understood, and the deficiencies thereof are recognized, the advantages offered by the present invention will be readily appreciated. In the prior art memory scanning circuit shown in FIG. 1, a memory 1, which may comprise a random access memory (RAM), a read only memory (ROM), a programmable read only memory (PROM), MNOS transistors, or the like, is provided with a plurality of addressable storage locations in which digital data is stored. A digital representation, such as a digital character, that is stored in a respective storage location in memory 1 may represent, for example, a particular channel, or broadcast frequency, to which an electronic digital tuner may be tuned. In some applications, the digital character may represent a particular time, such as time-of-day, associated with a timer that may be used with a signal receiver or the like. Memory 1 is connected to a write/read control circuit 2 for receiving a write/read control signal to establish whether data is written into memory 1 or read out therefrom. In the interest of simplification, the circuitry which normally is provided to supply data to be written into memory 1 is not shown.

The memory also is coupled to an address register 3 which supplies a digital address signal to memory 1 for designating a particular storage location in the latter that is to be accessed. Depending upon the write/read control signal which is supplied to the memory by write/read control circuit 2, a digital character either is written into the designated storage location or read out therefrom. For convenience, it is assumed that memory 1 is provided with eight individual addressable storage locations, and address register 3 is adapted to store a 3-bit address character which, depending upon each bit signal, is capable of addressing each of the eight storage locations.

A data register 4 is coupled to memory 1 for receiving the digital character which is read from the addressed storage location in the memory. The channel, or broadcast frequency, or the time which is represented by the read out digital character is displayed in a display circuit 5. As an example, this display circuit may be a conventional visual display for providing a numerical indication which is representative of the read out digital character. In addition, although not shown in FIG. 1, the digital character which is stored in data register 4 is used by processing circuitry to establish the tuning condition of the electronic digital tuner with which the illustrated apparatus is used. For example, this digital character may be adapted to determine the frequency of the local oscillating signal generated by a VCO in a phase-locked loop in the electronic tuner. As an alternative, this digital character may be converted to an analog voltage which, in turn, sets a voltage-controlled capacitor in a local oscillator of the tuner. Hence, the electronic digital tuner is tuned to the particular channel, or broadcast frequency, which is represented by the digital character read from memory 1.

The memory scanning circuit shown in FIG. 1 is adapted to change (i.e., either increment or decrement, that is, advance) the address character stored in address register 3, on a periodic, or step-wise basis. The scanning circuit is comprised of a scan switch 6, a clock signal oscillator 14, a control flip-flop circuit 13, a pre-settable counter 15 and an address counter 12. Scan switch 6 is connected to a source of potential 7 and is adapted, when closed, to connect this source of potential across a resistor 8. When the scan switch is closed, a positive potential is supplied, via this switch, to write/read control circuit 2, through an OR gate 9 to a reset input R of address counter 12, to the set input S of flip-flop circuit 13 and, additionally through an OR circuit 20 to the reset input R of pre-settable counter 15. Write/read control circuit 2 is responsive to this potential supplied thereto to apply a read/enable signal to memory 1. Consequently, upon closing scan switch 6, stored data can be read from the memory, depending upon the particular location therein which is addressed.

Flip-flop circuit 13 is a so-called R-S flip-flop circuit and assumes its set state when scan switch 6 is closed to supply a positive potential to the set input S thereof. The Q output of this flip-flop circuit is provided with a binary "1" when the set state thereof is assumed. This Q output is connected to an enable input of clock signal oscillator 14. When this Q output is a binary "1", the clock signal oscillator is enabled to commence generating clock signals which are supplied to the clock signal input C of pre-settable counter 15.

The reset input R of flip-flop circuit 13 is connected to a stop switch 17 which, when closed, supplies a positive potential to the reset input from a source of potential 18. A resistor 19 is provided between the output of stop switch 17 and reference potential, such as ground. The flip-flop circuit is adapted to assumes its reset state in response to the closing of switch 17; whereupon the Q output thereof is provided with a binary "0". This, in turn, interrupts the clock signals generated by clock signal oscillator 14.

Presettable counter 15 is a presettable binary counter whose count is adapted to be incremented in response to each clock signal which is supplied to its clock signal input C. Upon attaining a predetermined count, the pre-settable counter is reset to an initial count which may be pre-set as a function of the connections of terminals 16 or, alternatively, as a function of pre-set control signals which are supplied to terminals 16. An output clock pulse is generated by pre-settable counter 15 when it attains its predetermined count. Thus, it is appreciated that the pre-settable counter counts from an initial, preset count to a predetermined count in response to each clock signal which is supplied thereto. The output clock pulse generated by pre-settable counter 15 is delayed from the first clock signal which is supplied to its clock signal input C by a time which is determined by the initial, pre-set count thereof. Typically, this delay is on the order of about four to five seconds.

The output clock pulse generated by pre-settable counter 15 is returned to its reset input R via OR circuit 20. Thus, when scan switch 6 is closed, and also whenever pre-settable counter 15 attains its predetermined count so as to produce the output clock pulse, the count of the pre-settable counter is reset to its initial, pre-set count. This output clock pulse also is supplied to the count input C of address counter 12. The count of the address counter is changed, that is, it is incremented or decremented (referred to merely as being advanced) in response to each output clock pulse. Since these output clock pulses are generated at the rate of one every four or five seconds, it is seen that the count of address counter 12 is advanced at this slow rate. The count of address counter 12 is the address which is supplied to address register 3 and which designates the particular storage location in memory 1 which is to be accessed. Since this address changes ever four or five seconds, the tuning condition of the electronic digital tuner with which memory 1 is used likewise is changed ever four or five seconds. That is, a particular channel, or broadcast frequency, is maintained for four or five seconds to enable the user to determine whether the received program information is acceptable.

Each bit included in the count of address counter 12 (assumed herein to be a 3-bit count) is supplied to a respective input of an AND gate 10. This AND gate functions to detect when the count of address counter 12 reaches its maximum count (e.g. 111) to produce a reset signal which is supplied, via OR circuit 9, to the reset input R of the address counter. Thus, the count of address counter 12 is advanced from an initial, reset count (e.g. 000) to its maximum count (111) cyclically. It is seen that the address counter also is reset to its initial count (000) when scan switch 6 is closed.

Briefly, in operation, when scan switch 6 is closed, write/read control circuit 2 is actuated to supply a read control signal to memory 1. Also, address counter 12 is reset to an initial count (000), pre-settable counter 15 is pre-set to an initial count, and flip-flop circuit 13 is set to its set state. The initial address to which address counter 12 is reset is supplied to address register 3, and the digital character stored in the storage location corresponding to this initial address is read out therefrom to data register 4. It is seen that this first digital character is read out rapidly in response to the closing of scan switch 6.

Since flip-flop circuit 13 is set, clock signal oscillator 14 is enabled to commence the supply of clock signals to pre-settable counter 15. The pre-settable counter counts each of these clock signals until it reaches a predetermined count. At that time, pre-settable counter 15 generates its output clock pulse which advances the address count of address counter 12 and, additionally, returns the pre-settable counter to its initial, preset count. In accordance with the assumptions made hereinabove, the output clock pulse signal which is generated by pre-settable counter 15 is delayed by about four or five seconds from the first clock signal which is supplied thereto by clock signal oscillator 14. The pre-settable counter may be thought of as a divide-by-N circuit, wherein N is pre-set by the control signals supplied to terminals 16 thereof.

As the address count of address counter 12 is advanced, the corresponding storage location of memory 1 is addressed, and the digital character stored therein is read out to data register 4. The memory address is advanced in response to each output clock pulse that is generated by pre-settable counter 15. When the address counter reaches its maximum count, this is detected by AND gate 10 which then resets the address counter to its initial address count. The foregoing cycle of operations then is repeated.

If, at any time during the scanning of memory 1, the user is satisfied that the digital character which is read from memory 1 and which is displayed on display device 5 represents a desired channel, or broadcast frequency, stop switch 17 may be closed. Flip-flop circuit 13 is reset upon the closing of this stop switch, whereupon the Q output of the flip-flop circuit is changed over to a binary "0". This interrupts further operation of clock signal oscillator 14, such that pre-settable counter 15 no longer is incremented. As a consequence thereof, the last-attained address count of address counter 12 is retained therein; and the scanning of memory 1 is terminated. The digital character which last had been read from the memory remains in data register 4. Of course, if the scanning operation is to be resumed, scan switch 6 is operated once again to reset address counter 12 and pre-settable counter 15, and also to set flip-flop circuit 13 so as to enable clock signal oscillator 14. The foregoing operation then is repeated.

It is appreciated that scan switch 6 and stop switch 17 may be formed as push-button switches, momentary-closure switches, or the like.

Figure 2:
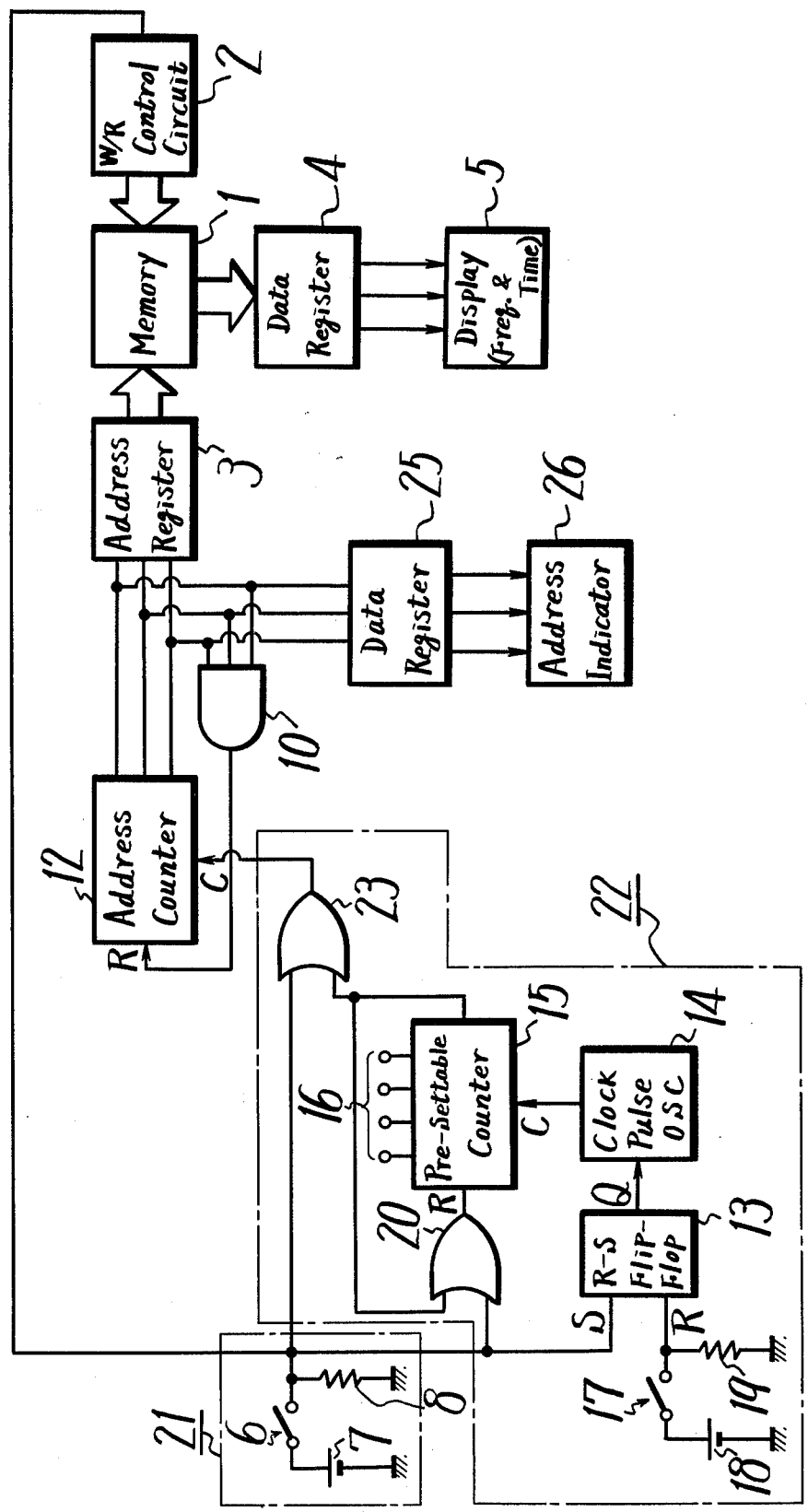
FIG. 2 is a block diagram of one embodiment of apparatus in accordance with the present invention for scanning an addressable memory.

The scanning operation performed by the scanning circuitry shown in FIG. 1 is capable of scanning the contents of memory 1 only at the predetermined rate which is established by the generation of clock pulses by pre-settable counter 15. Although the first addressable location in the memory is addressed promptly upon the closure of scan switch 6, additional storage locations are not addressed for quite some time. There may be situations in which the user of the illustrated apparatus wishes to advance the scanning of memory 1 at a rapid rate without waiting the four or five seconds for each scan advance. For example, if each digital character which is read from memory 1 represents a respective channel, or broadcast frequency, the user may recognize almost immediately the program information which is received, and may wish to advance the tuning condition of the electronic digital tuner promptly to the next predetermined channel, or broadcast frequency. This rapid advance in the scanning of memory 1 is not possible in the prior art scanning circuit shown in FIG. 1. It is an important feature of the present invention that this rapid advance in the scanning of memory 1 can be achieved, as desired by the user. The apparatus which scans memory 1, in accordance with the present invention, is illustrated in FIG. 2. Those elements of FIG. 2 which are substantially identical to the aforedescribed corresponding elements in FIG. 1 are identified by the same reference numerals. In the embodiment shown in FIG. 2, flip-flop circuit 13, clock signal oscillator 14 and pre-settable counter 15 are included in a clock pulse generator 22. Scan switch 6 is included in a scan advance circuit 21. A primary difference between the circuit shown in FIG. 1 and the embodiment of the present invention shown in FIG. 2 is that an OR gate 23 has respective inputs connected to receive the clock pulse generated by pre-settable counter 15 and the positive potential which is produced when scan switch 6 is closed. The output of OR gate 23 is connected to the clock pulse input C of address counter 12. It is appreciated that when either scan switch 6 is closed or a clock pulse is generated, OR gate 23 supplies a scan advance pulse to address counter 12, thereby advancing (i.e., incrementing or decrementing) the address count of this address counter.

Furthermore, the reset input R of address counter 12 is connected only to AND gate 10. That is, contrary to the circuit shown in FIG. 1, in the embodiment of the present invention shown in FIG. 2, address counter 12 is not reset in response to each closing of scan switch 6.

In operation, when scan switch 6 is closed, flip-flop circuit 13 is set, pre-settable counter 15 is reset to its initial pre-set count, and write/read control circuit 2 is actuated to supply the read-enable signal to memory 1. In addition, the address count of address counter 12 is advanced from whatever its immediately preceding count had been to the next successive count. This new address count is supplied to address register 3 and used to address the corresponding storage location in memory 1. The digital character which is stored in this addressed location is read out therefrom and stored in data register 4. In addition, display circuit 5 displays the representation of this digital character.

In addition to supplying the address count from address counter 12 to address register 3, this address count also is stored in a data register 25 and indicated in an address indicator 26. These circuits are provided so as to afford a direct indication of the memory storage location which then is being addressed.

As before, when flip-flop circuit 13 is set in response to the closing of scan switch 6, clock signal oscillator 14 is enabled to supply clock signals to pre-settable counter 15. These clock signals are counted by the pre-settable counter and, when this counter attains its predetermined count, it generates a clock pulse to advance the address count of address counter 12. In addition, this clock pulse is fed back via OR gate 20 to the reset input R of the pre-settable counter, thereby returning the count of pre-settable counter 15 to its initial, pre-set count. The pre-settable counter then continues to count the clock signals which are supplied thereto by clock signal oscillator 14. Thus, it is seen that, similar to the circuit shown in FIG. 1, an automatic memory scanning operation may be carried out in response to the closing of scan switch 6, whereby successive storage locations in the memory are addressed sequentially at the rate of about one storage location every four or five seconds. Thus, the tuning condition of the electronic digital tuner with which memory 1 may be used is changed from one channel, or broadcast frequency, to another at the rate of every four or five seconds. As the scanning of memory 1 advances, the data read therefrom is displayed in display circuit 5. Also, the sequentially advancing address is indicated in address indicator 26.

The user may advance the address count of address counter 12 as desired, merely by manually closing scan switch 6 to carry out such an advance. When this scan switch is closed, a positive potential is supplied therethrough to OR gate 23, and thence to the clock pulse input C of address counter 12. This advances the address count of the address counter. In addition, the positive potential supplied by the closing of scan switch 6 is supplied through OR gate 20 to return pre-settable counter 15 to its initial, pre-set count. As the address count is advanced, address indicator 26 provides an indication of this new address. Also, the data which is stored in the storage location now designated by the new address count is read out therefrom to data register 4, and is displayed in display circuit 5.

It is appreciated that, rather than waiting for the count of address counter 12 to be advanced in response to each clock pulse generated by pre-settable counter 15, the user may advance this count rapidly merely by closing scan switch 6. Contrary to the circuit shown in FIG. 1., each manual closure of scan switch 6 does not reset the count of address counter 12 to an initial, predetermined count. Rather, as scan switch 6 is closed, the embodiment shown in FIG. 2 advances the count attained by the address counter in a step-wise manner. The user need not be subjected to an undesired delay in scanning the addressable storage location of memory 1. Instead, the memory may be scanned at an increased rate, depending only upon the rate at which the user closes scan switch 6.

Of course, if the address count of address counter 12 is advanced until the maximum count thereof is reached, AND gate 10 detects this maximum count and resets the address counter to its initial, predetermined count.

If the user wishes to terminate the memory scanning operation, stop switch 17 is closed so as to reset flip-flop circuit 13, as described above with respect to the circuit shown in FIG. 1. It is recalled that, when this flip-flop circuit is reset, clock signal oscillator 14 no longer supplies clock signals to pre-settable counter 15, thereby interrupting the clock pulses which are supplied to the clock pulse input C of address counter 12. As a consequence thereof, the address count of this address counter remains at its last-attained value. The scanning operation may be resumed if scan switch 6 is closed.

It is appreciated that, regardless of the count of pre-settable counter 15, each time that scan switch 6 is closed results in an increment (or decrement) in the address count of address counter 12. If the scan switch is not closed, the address count is not advanced until pre-settable counter 15 reaches its predetermined count so as to supply a clock pulse to address counter 12.

Another embodiment of the apparatus for scanning memory 1 in accordance with the present invention is illustrated in the block diagram shown in FIG. 3. This embodiment is substantially similar to that described hereinabove with respect to FIG. 2, and further includes a register 36 having one set of inputs connected to data register 4 to receive the digital character read out from memory 1, and another set of inputs connected to an up/down control circuit 37 to receive and store a digital character determined by the operation of this up/down control circuit. The digital character stored in register 36 is supplied to display circuit 5 and, additionally, to an output circuit 24. This output circuit may be included in the electronic digital tuner, such as the local oscillator thereof, and is adapted to respond to the digital character supplied thereto to establish the tuning condition of the tuner.

Up/down control circuit 37 is connected via a control switch 31 to a source of operating potential 32. A resistor 33 is connected between the output of control switch 31 and a reference potential, such as ground. Depending upon the pre-conditioning of the up/down control circuit (not shown) the closing of control switch 31 energizes the up/down control circuit to increment or decrement the digital character which is stored in register 36.

Since the closing of control switch 31 modifies the data stored in register 36 to the extent that it does not correspond to the data which is stored in the addressed storage location of memory 1, the indication of the address which then is produced by address counter 12 and which is stored in data register 25 and indicated in address indicator 26 may be ambiguous. That is, when control switch 31 is closed, the data stored in register 36 is not related to the address stored in data register 25. Accordingly, a flip-flop circuit 34 is connected to data register 25 for enabling the data register to store the address count of address counter 12 when the flip-flop circuit is set, and to clear the data register when the flip-flop circuit is reset. The reset input of flip-flop circuit 34 is connected to control switch 31 such that when this switch is closed, the flip-flop circuit is reset and data register 25 is cleared. The set input of this flip-flop circuit is connected to scan switch 6 such that this flip-flop circuit is set, and data register 25 is enabled, when scan switch 6 is closed.

Similar to the circuit described above with respect to FIG. 1, OR gate 9 is connected to the reset input R of address counter 12. One input of this OR gate is connected to the output of AND gate 10, and the other input is connected to control switch 31. Thus, when the control switch is closed, the address count of address counter 12 is reset to an initial, predetermined count. The address counter also is reset when AND gate 10 detects that the maximum count of the address counter has been attained.

Another OR gate 35 is connected to the reset input R of flip-flop circuit 13. One input of this OR gate is connected to stop switch 17, and the other input thereof is connected to control switch 31. Thus, when either stop switch 17 or control switch 31 is closed, flip-flop circuit 13 is reset so as to inhibit clock signal oscillator 14 from supplying clock signals to pre-settable counter 15.

In operation, when scan switch 6 is closed, write-/read control circuit 2 is activated to supply the read-enable signal to memory 1, as described above. Also, flip-flop circuit 13 is set so as to enable clock signal oscillator 14 to supply clock signals to pre-settable counter 15. The closing of scan switch 6 resets the pre-settable counter to its initial, pre-set count. Still further, the address count of address counter 12 is advanced in response to the closing of this scan switch.

The clock signals supplied by clock signal oscillator 14 are counted by the pre-settable counter until the latter reaches its predetermined count to generate the output clock pulse which advances the count of address counter 12, all as described above. This address count is stored in address register 3 to access the corresponding storage location of memory 1. The digital character stored in this accessed storage location is read therefrom to data register 4 and then into register 36 from which it is displayed on display circuit 5 and utilized by output circuit 24. Furthermore, the address count of address counter 12 is supplied to data register 25, which had been enabled by the setting of flip-flop circuit 34 in response to the closing of scan switch 6. Each time that pre-settable counter 15 reaches its predetermined count, it is returned to its initial, pre-set count so as to be incremented once again in response to the clock signals supplied thereto by the clock signal oscillator. Thus, a clock pulse is generated every four or five seconds to advance the address count of address counter 12. Therefore, memory 1 is scanned at this rate.

If the user manually closes scan switch 6 at any time during this scanning operation, the positive potential supplied therefrom through OR gate 23 to address counter 12 advances the address count therein. Thus, memory 1 may be scanned automatically at the scanning rate of the clock pulses which are generated by pre-settable counter 15 or in response to each closure of scan switch 6, all as discussed above. The automatic scanning operation may be terminated by closing stop switch 17 which, as described previously, resets flip-flop circuit 13 to inhibit clock signal oscillator 14 from supplying additional clock signals to pre-settable counter 15.

When control switch 31 is closed, for example, in order to change the tuning condition of the electronic digital tuner to a channel, or broadcast frequency, whose representation is not stored in memory 1, flip-flop circuit 13 is reset so as to terminate the automatic memory scan operation. In addition, flip-flop circuit 34 is reset so as to clear the address count stored in data register 25. Furthermore, address counter 12 is reset to an initial address count, and the contents of the corresponding storage location of memory 1 are read out therefrom. As an example, a zero digital character may be stored in this storage location. Furthermore, upon closing control switch 31, up/down control circuit 37 is operated to produce an incrementing or decrementing digital character to register 36. As this digital character is changed, the tuning condition of the electronic digital tuner likewise is changed. When a desired tuning condition is reached, control switch 31 may be opened such that the program information which then is received by the channel, or broadcast frequency, to which the tuner is tuned can be perceived.

Thus, it is seen that, in accordance with one aspect of the present invention, memory 1 may be scanned periodically in response to the clock pulses which are generated by pre-settable counter 15 or, alternatively, the memory may be scanned in response to successive closing of scan switch 6. That is, each time the scan switch is closed, the addressed storage location in memory 1 is advanced on a step-wise basis.

While the present invention has been particularly shown and described with reference to preferred embodiments, it should be readily apparent to those of ordinary skill in the art that various changes and modifications in form and details may be made without departing from the spirit and scope of the invention. For example, in place of pre-settable counter 15, a monostable multivibrator may be provided to produce a pulse which is used to advance address counter 12. Such pulses may be produced at the rate of one every four or five seconds, the same rate at which the clock pulses are generated by pre-settable counter 15. Also, address counter 12 may be advanced by more than one count (for example, by two, three or more counts, as desired) in response to each closing of scan switch 6. It is intended that the appended claims be interpreted so as to include this as well as other such changes and modifications.

What is claimed is:

1. Apparatus for scanning an addressable memory comprising means for generating clock pulses; address counting means for counting said clock pulses to produce an address for said addressable memory; means for supplying said address to said addressable memory to desginate a corresponding storage location therein from which stored data is read; means for selectively enabling said clock pulse generating means to supply said clock pulses to said address counting means; scan advance means selectively operable to change the count of said address counting means by a predetermined amount in response to each operation thereof; and OR-gate means responsive to the operation of said scan advance means or to a generated clock pulse to change the count or said address counting means, and thereby change the designated storage location in said addressable memory.

2. The apparatus of claim 1 wherein said means for generating clock pulses comprises clock pulse oscillating means; and wherein said means for selectively enabling said clock pulse generating means comprises energizable scan switch means; bi-state means actuated to a first state in response to the energization of said scan switch means to initiate the operation of said clock pulse oscillating means; and means for actuating said bi-state means to a second state to interrupt the operation of said clock pulse oscillating means.

3. The apparatus of claim 2 wherein said means for actuating said bi-state means to a second state comprises energizable stop switch means.

4. The apparatus of claim 1 wherein said means for generating clock pulses comprises clock oscillating means selectively operable to produce periodic clock signals; and clock signal counting means coupled to said clock oscillating means to count said periodic clock signals and to generate a clock pulse when a predetermined number of clock signals have been counted.

5. The apparatus of claim 4 wherein said clock signal counting means comprises a pre-settable counter responsive to said means for selectively enabling said clock pulse generating means to be pre-set to an initial count and responsive to the clock pulse generated thereby to return to said initial count.

6. The apparatus of claim 1 wherein said scan advance means comprises a source of potential, and a switch coupled to said source of potential and operable to supply said potential to said OR-gate means.

7. The apparatus of claim 6 further comprising register means for receiving and storing the address produced by said address counting means; and indicator means coupled to said register means for indicating the address stored therein.

8. The apparatus of claim 7 further comprising detecting means coupled to said address counting means to detect when a predetermined address has been reached; and means for resetting the count of said address counting means when said predetermined address is detected.

9. The apparatus of claim 8 wherein said detecting means comprises AND gate means having inputs connected to corresponding outputs of said address counting means.

10. The apparatus of claim 1 further comprising register means for receiving the stored data read from said addressable memory; means for supplying data to said register means independently of the data read from said addressable memory; and switching means selectively operable to actuate said means for supplying data to said register means while concurrently resetting the count of said address counting means to a predetermined address.

11. The apparatus of claim 10 further comprising detecting means coupled to said address counting means to detect when a predetermined count has been reached thereby and to reset the count of said counting means to said predetermined address.

12. The apparatus of claim 11 further comprising means responsive to the selective operation of said switching means to inhibit said clock pulse generating means from supplying said clock pulses to said address counting means.

13. The apparatus of claim 10 further comprising display means coupled to said register means to display the data stored therein.

14. The apparatus of claim 1 wherein the data stored in said addressable memory represents respective signal receiving channels to which tuning means is tunable.

15. Apparatus for scanning an addressable memory comprising clock pulse generating means for generating output clock pulses at a predetermined rate; address counting means having an input for receiving said output clock pulses and being operative to count the received output clock pulses for providing an address for said addressable memory; means for supplying said address to said addressable memory to designate a corresponding storage location therein from which stored data is read; means for selectively enabling said clock pulse generating means to supply said output clock pulses to said address counting means; scan advance means selectively actuable to provide, for each actuation, a count changing signal which, when applied to said input of the address counting means, is counted by the latter so as to change the count of the address counting means by an amount equivalent to the change in the count effected by each said output clock pulse; and means alternatively applying said output clock pulses and each said count changing signal to said input of the address counting means so that said count of the latter, and hence the designated storage location in said addressable memory, are changed either at said predetermined rate of generation of said output clock pulses or at a rate at which said scan advance means is repetitively actuated.

* * * * *